United States Patent [19]
Nayebi et al.

[11] Patent Number: 5,719,532
[45] Date of Patent: Feb. 17, 1998

[54] HORIZONTAL LOCK DETECTOR

[75] Inventors: Mehrdad Nayebi, Palo Alto; Duc Ngo, San Jose, both of Calif.

[73] Assignees: Sony Corporation, Tokyo, Japan; Sony Electronics Inc., Park Ridge, N.J.

[21] Appl. No.: 584,750

[22] Filed: Jan. 11, 1996

Related U.S. Application Data

[60] Provisional application No. 60/000,406 Jun. 21, 1995.
[51] Int. Cl.$^6$ .............................. H03L 7/095; H03L 7/00
[52] U.S. Cl. .............................. 331/20; 331/1 A; 331/17; 331/DIG. 2
[58] Field of Search .................... 331/20, 17, DIG. 2, 331/1 A; 348/540

[56] References Cited

U.S. PATENT DOCUMENTS

| | | | |
|---|---|---|---|
| 4,393,412 | 7/1983 | Tatami | 358/318 |
| 4,636,836 | 1/1987 | Steckler et al. | 358/19 |
| 4,698,601 | 10/1987 | Aizawa | 331/1 A |
| 4,729,013 | 3/1988 | Tatami et al. | 358/19 |
| 4,802,032 | 1/1989 | Tatsuzawa et al. | 360/77.13 |
| 4,891,608 | 1/1990 | Ikeda | 331/20 |
| 5,124,671 | 6/1992 | Srivastava | 331/10 |
| 5,179,450 | 1/1993 | Ando et al. | 358/312 |
| 5,245,430 | 9/1993 | Nishimura | 358/149 |
| 5,256,989 | 10/1993 | Parker et al. | 331/1 A |
| 5,278,520 | 1/1994 | Parker et al. | 331/1 A |
| 5,304,953 | 4/1994 | Heim et al. | 331/1 A |
| 5,374,900 | 12/1994 | Masumoto | 331/1 A |
| 5,534,821 | 7/1996 | Akiyama et al. | 331/8 |

*Primary Examiner*—Timothy P. Callahan
*Assistant Examiner*—An T. Luu
*Attorney, Agent, or Firm*—Haverstock & Associates

[57] ABSTRACT

A horizontal lock detector circuit monitors charge pump control signals within a horizontal phase-lock loop to determine when the sampling pulses generated by the video system are locked in phase with the synchronization pulses of the input composite video signal. An output signal is generated by the lock detector circuit which is active when the sampling pulses are locked in phase with the input signal and inactive when the sampling pulses are not locked in phase with the input signal. The charge pump control signals are generated by a phase detector circuit within the phase-lock loop in response to a difference in phase between the sampling pulses and the input signal. Once the sampling pulses are locked in phase with the input signal, the charge pump control signals will become inactive. A current source is enabled when either of the charge pump control signals are active. The current source builds up a first level of charge on a first capacitor during the horizontal blanking period. A detecting circuit monitors the first level of charge to determine when it rises above a first threshold value. A second level of charge is built up on a second capacitor when the first level of charge is above the first threshold value. An output circuit is coupled to the second capacitor for generating an output signal which is activated when the second level of charge fell below a second threshold value and deactivated when the second threshold level of charge rises above a third threshold level. When the output signal is active the sampling pulses are locked together in phase with the input signal.

25 Claims, 3 Drawing Sheets

HORIZONTAL LOCK DETECTOR

RELATED APPLICATIONS

This application claims priority under 35 U.S.C. §119(e) of the co-pending U.S. provisional application Ser. No. 60/000,406 filed on Jun. 21, 1995 and entitled "Horizontal Lock Detector." The provisional application Ser. No. 60/000,406, filed on Jun. 21, 1995 and entitled "Horizontal Lock Detector" is also hereby incorporated by reference.

FIELD OF THE INVENTION

The present invention relates to the field of locking the phase and frequency of sampling pulses in phase with an input signal. More particularly, the present invention relates to the field of detecting when the sampling pulses are locked in phase and frequency with the input signal.

BACKGROUND OF THE INVENTION

A composite video signal contains information which is used by a video system to generate a video picture on a display, monitor or television. Each period, within the horizontal portion of a composite video signal contains information representing one horizontal provided line which is to be output on the video display, monitor or television. Each horizontal period includes a horizontal synchronization pulse, a burst signal and a video information signal. In many video transmission systems, color or chrominance information is represented by a particular phase of the chrominance subcarrier signal that is amplitude modulated with color information. The horizontal synchronization pulse is used by a phase locked loop to synchronize the system for displaying the next horizontal line of video information. The burst signal is used to synchronize the phase of the sampling pulses with the phase of the color subcarrier signal. Separator circuits are utilized to separate the horizontal synchronizing signal and the burst signal from the incoming video signal. The burst signal has a burst signal frequency equal to 3.58 MHz, which is the frequency of the chrominance subcarrier $f_{sc}$. The video information signal then comprises the chrominance subcarrier having different phases amplitude-modulated with chrominance information. The composite color video signal includes both luminance and chrominance information.

A video picture or frame is made up of a number of horizontal lines included within the video display. To display a video picture or frame the video system begins at the top of the screen and displays the information within the composite video signal one horizontal line at a time. The information for each horizontal line is contained within a horizontal period of the composite video signal. After each horizontal period, the video system moves to the next line and displays the information within the next horizontal period of the composite video system. This continues until the video system reaches the bottom line on the video display. After displaying the video information on the bottom line of the video display, the video system must reset itself to the top of the display in order to begin displaying the next frame.

A sync separator circuit is used to separate the horizontal synchronization pulses from the composite video signal. The output of the sync separator circuit is used by a horizontal phase lock loop to lock the video system in phase with the composite video signal during the horizontal period of each frame. The horizontal phase-lock loop is used to lock in phase and frequency the sampling pulses generated by the video system relative to the incoming horizontal synchronization signals. The actual phase of the sampling pulses relative to the horizontal synchronization signal may drift from the phase-lock relationship. This drift may be due to temperature changes in temperature-sensitive circuit components, changes in the operation of such components due to age, and the like. As a result of this phase shift in the sampling pulses, errors, such as phase errors, may be introduced into the sampled signal. If left uncorrected, the video picture reproduced from the sampled video signal, may be erroneous.

In order to correct the above-mentioned phase errors, a horizontal phase-lock loop is used to detect errors in phase and adjust the phase of the sampling pulses accordingly. A charge pump circuit is generally included within a phase-lock loop. The charge pump circuit is provided with one or more control input signals. A level of charge is built up on a circuit storage element, typically a capacitor, in response to the control signals. The control input signals are typically provided from a phase detector circuit which generates one or more control signals representative of the difference in the phase of the two signals which are to be locked in phase together. The charge built up on the circuit storage element then corresponds to the level of the control signal generated by the phase detector circuit. Within phase-lock loops the charge which is built up on the circuit storage element is used to control the frequency of an output signal generated by a voltage controlled oscillator. By varying the charge stored on the circuit storage element using the charge pump circuit, the frequency and phase of the signal generated by the voltage controlled oscillator is controlled and locked to the phase and frequency of a reference signal.

A basic architecture of a conventional charge pump circuit of the prior art is illustrated in FIG. 1. The charge pump circuit includes two current sources IUp and IDown, two switches S1 and S2 and the charge pump capacitor CH. A first terminal of the current source IUp is coupled to a voltage source VCC. A second terminal of the current source IUp is coupled to a first terminal of the switch S1. A second terminal of the switch S1 is coupled to a first terminal of the switch S2 and a first terminal of the capacitor CH. A second terminal of the capacitor CH is coupled to ground. A second terminal of the switch S2 is coupled to a first terminal of a current source IDown. A second terminal of the current source IDown is coupled to ground. A control signal UP is coupled to control the operation of the switch S1. A control signal DOWN is coupled to control the operation of the switch S2.

The control signals UP and DOWN are provided from a phase detector circuit within a phase-lock loop in response to a difference in phase between a signal and the sampling pulses. Accordingly, if there is a positive phase difference between the signal and the sampling pulses, the control signal DOWN will be activated in order to correct the phase difference by discharging the capacitor CH through the current source IDown. If there is a negative phase difference between the signal and the reference signal, the control signal UP will be activated in order to correct the phase difference by charging the capacitor CH from the current source IUp. The voltage stored across the capacitor CH is then used by an oscillating circuit to modify the phase and frequency of the signal until it is locked in phase with the reference signal. When the sampling pulses are locked in phase with the input signal, the control signals UP and DOWN both remain inactive or at a logical low voltage level.

SUMMARY OF THE INVENTION

A horizontal lock detector circuit monitors charge pump control signals within a horizontal phase-lock loop to determine when the sampling pulses generated by the video system are locked in phase with the horizontal synchronization pulses of the input composite video signal. An output signal is generated by the horizontal lock detector circuit which is active when the sampling pulses are locked in phase with the input composite video signal and inactive when the sampling pulses are not locked in phase with the input composite video signal. The charge pump control signals are generated by a phase detector circuit within the horizontal phase-lock loop in response to a difference in phase between the sampling pulses and the input composite video signal. Once the sampling pulses are locked in phase with the input composite video signal, the charge pump control signals will become inactive. When the charge pump control signals are inactive for a predetermined period of time, signalling that the sampling pulses are locked in phase with the input composite video signal, the output of the horizontal lock detector circuit is activated and will remain active until the charge pump control signals are again active.

A current source is enabled when either of the charge pump control signals are active. The current source builds up a first level of charge on a first capacitor during a horizontal blanking period. A detecting circuit monitors the first level of charge to determine when it rises above an active threshold value. A second level of charge is built up on a second capacitor when the first level of charge is above the active threshold value. An output circuit is coupled to the second capacitor for generating an output signal which is activated when the second level of charge falls below a locked threshold value and deactivated when the second level of charge rises above an unlocked threshold level. When the output signal is active the sampling pulses are locked together in phase with the input composite video signal.

DESCRIPTION OF THE PREFERRED EMBODIMENT

Figure 1:
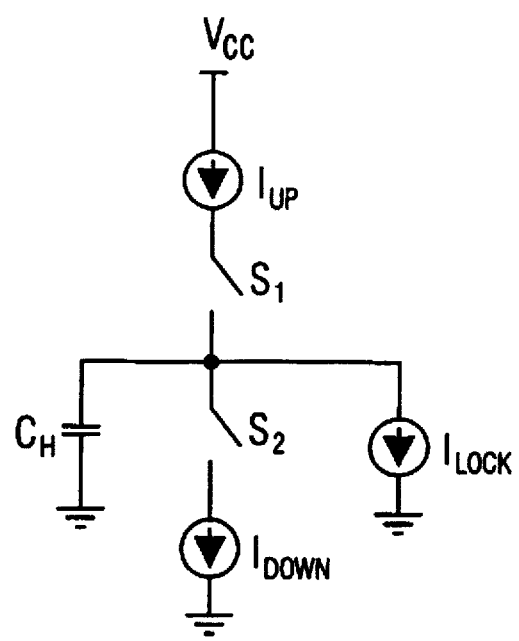
FIG. 1 illustrates a schematic diagram of a conventional charge pump circuit.

A horizontal lock detector circuit within a video system monitors a pair of control signals to a charge pump in order to determine when sampling pulses generated by the video system are locked in phase with horizontal synchronization signals within an input composite video signal. The charge pump forms a portion of a horizontal phase-lock loop circuit. The charge pump control signals UP and DOWN are generated by a phase detector circuit within the horizontal phase-lock loop in response to a difference in phase between the sampling pulses and the horizontal synchronization pulses of the input composite video signal. In response to the charge pump control signals, a charge pump circuit generates an output which is used to either increase or decrease the frequency of the sampling pulses in order to lock the sampling pulses in phase with the input composite video signal. Once the sampling pulses are locked in phase with the input composite video signal, the charge pump control signals will become inactive. An output signal is generated by the horizontal lock detector circuit which is active when the sampling pulses are locked in phase with the input composite video signal and inactive when the sampling pulses are not locked in phase with the input composite video signal.

The horizontal lock detector circuit also receives the charge pump control signals as inputs for determining when the charge pump control signals both become inactive. As long as either of the charge pump control signals UP or DOWN are active, a difference in phase exists between the sampling pulses generated by the video system and the input composite video signal while this difference in phase exists and the charge pump control signals UP and DOWN are active, the output signal of the horizontal lock detector circuit will remain inactive. When the charge pump control signals are inactive for a predetermined period of time that signals that the sampling pulses are locked in phase with the input composite video signal. At such a time, the output of the horizontal lock detector circuit is activated and will remain at a logical high voltage level until the charge pump control signals are again active.

If the charge pump control signals are active during a horizontal blanking period, then a charge is built up across a first storage element, raising a voltage level across the first storage element. During the horizontal blanking period, a horizontal blanking signal HB is at a logical low voltage level. During this horizontal blanking period, while the horizontal blanking signal HB is at a logical low voltage level, the horizontal synchronization pulse is present on the input composite video signal. The voltage level across the first storage element is only charged up during the horizontal blanking period, when the horizontal blanking signal HB is inactive. The first storage element is discharged when the horizontal blanking signal HB is active.

During the horizontal blanking period, the voltage level across the first storage element is increased, when the charge pump control signals are active, until it reaches an active threshold level. When the voltage level across the active storage element reaches the first threshold level, an output of a flip-flop is set to a logical high voltage level. The output of the flip-flop is reset at the end of the horizontal blanking period when the horizontal blanking signal HB rises to a logical high voltage level. While the output of the flip-flop is at a logical high voltage level it is used to build up a charge and raise a voltage level across a second storage element. When the voltage level across the second storage element reaches an unlocked threshold level, an output signal is pulled to a logical low voltage level, signalling that the sampling pulses are not locked in phase with the input composite video signal. The output signal is maintained at the logical low voltage level as long as the charge pump control signals are active.

When the charge pump control signals UP and DOWN are both inactive, the voltage level across the first storage element is not increased and will therefore never reach the active threshold level to set the output of the flip-flop. Because the output of the flip-flop is not set, the second storage element will get discharged through a resistor causing the voltage level across the second storage element to drop. Under these conditions, after the voltage level across the second storage element decreases past a locked threshold level, the output signal is raised to a logical high voltage level, signalling that the sampling pulses are locked in phase with the input composite video signal. The output signal is maintained at the logical high voltage level until the charge pump control signals are again active.

Figure 2:
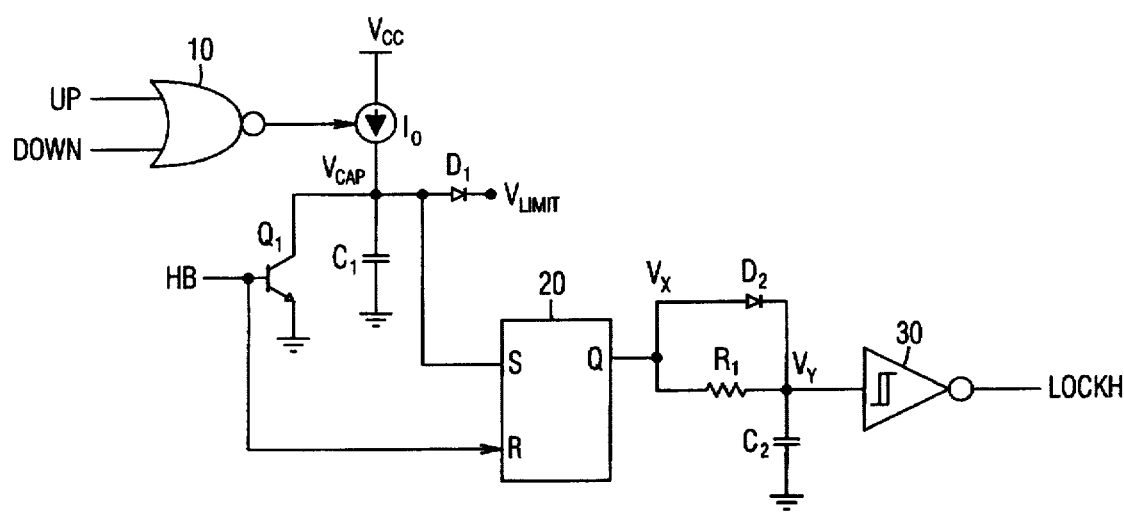
FIG. 2 illustrates a schematic diagram of a horizontal lock detector circuit of the present invention.

A schematic block diagram of a horizontal lock detector circuit of the present invention is illustrated in FIG. 2. A horizontal blanking signal HB is at a logical low voltage level during the horizontal blanking period, when the synchronization pulse is present within the input composite video signal. During non-horizontal blanking periods, the horizontal blanking signal HB is at a logical high voltage level. The horizontal blanking signal HB is coupled to a base of an npn transistor Q1 and to a reset input of an RS flip-flop 20. Control signals UP and DOWN, which are generated within a horizontal phase-lock loop in order to control a charge pump circuit, are coupled as inputs to a logical NOR gate 10. The control signals UP and DOWN are provided from a phase detector circuit 40 for controlling the charge pump circuit 46. The charge pump circuit 46 includes the components illustrated in FIG. 1 and operates as described above. An input composite video signal is coupled to a synchronization separation circuit 42, which separates the synchronization signals from the input composite video signal as is well known in the art. An output of the synchronization separation circuit 42 is coupled as an input to the phase detector circuit 40. Sampling pulses are generated by a sampling pulse generator circuit 44 and coupled as an input to the phase detector circuit 40. The phase detector circuit 40 compares the phase of the two input signals and activates the control signals UP and DOWN appropriately, as is well known in the art, to bring the two it;put signals into phase. The charge pump circuit 46 stores a level of charge controlled by the control signals UP and DOWN, as described above, which is provided to the sampling pulse generator circuit 44 in order to appropriately change the phase of the sampling pulses generated by the sampling pulse generator circuit 44. An output of the logical NOR gate 10 is coupled to control a current source IO. A first terminal of the current source IO is coupled to a supply voltage VCC. A collector of the transistor Q1 is coupled to a second terminal of the current source IO, to a first terminal of a detection capacitor C1, to an anode of a diode D1 and to a set input of the RS flip-flop 20, thereby forming a voltage node VCAP representative of the voltage level across the capacitor C1. An emitter of the transistor Q1 is coupled to ground. A second terminal of the capacitor C1 is coupled to ground. A cathode of the diode D1 is coupled to a constant biasing voltage VLimit. The diode D1 and the constant biasing voltage Vlimit keep the voltage level at the voltage node VCAP from falling below a known value equal to a diode drop plus the value of the constant biasing voltage VLimit. This prevents the current source IO from saturating.

An output Q of the RS flip-flop 20 is coupled to an anode of a diode D2 and to a first terminal of a resistor R1, thereby forming a voltage node VX representative of the voltage level of the output of the RS flip-flop 20. A cathode of the diode D2 is coupled to a second terminal of the resistor R1, to a first terminal of a delay capacitor C2 and to an input of an inverting schmitt trigger circuit 30, thereby forming a voltage node VY representative of the voltage level across the capacitor C2. A second terminal of the capacitor C2 is coupled to ground. An output of the inverting schmitt trigger circuit 30 provides an active high output LockH of the horizontal lock detector circuit of the present invention.

Figure 3:
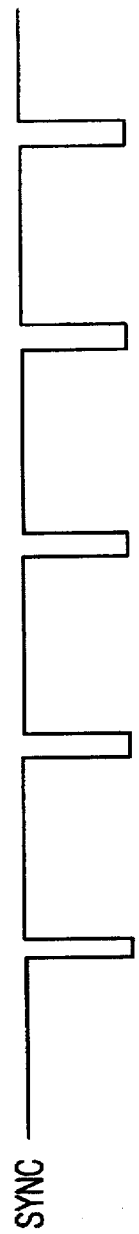
FIG. 3a illustrates a timing diagram of a horizontal synchronization signal Sync separated from an input composite video signal and supplied to the horizontal lock detector circuit of FIG. 2.
FIG. 3b illustrates a timing diagram of a horizontal blank signal HB supplied to the horizontal lock detector circuit of FIG. 2.
FIG. 3c illustrates a timing diagram of a signal at a voltage node VX within the horizontal lock detector circuit of FIG. 2.
FIG. 3d illustrates a timing diagram of a signal at a voltage node VY within the horizontal lock detector circuit of FIG. 2.
FIG. 3e illustrates a timing diagram of an output signal LockH with the horizontal lock detector circuit of FIG. 2.
Figure 3:
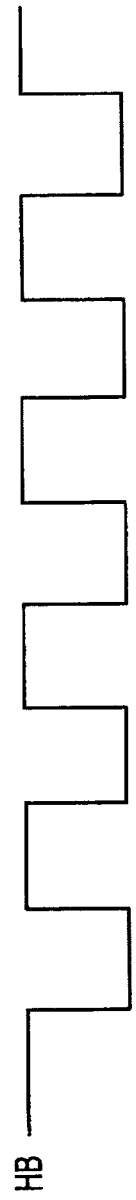
Figure 3:
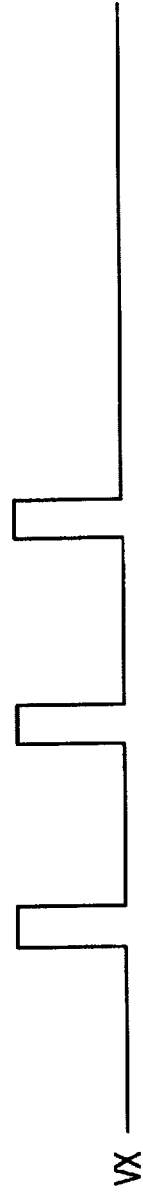
Figure 3:
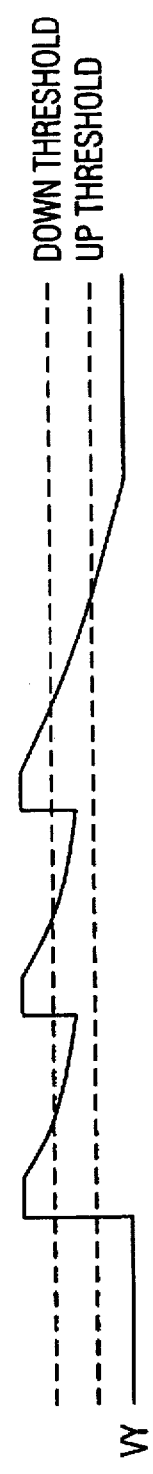
Figure 3:
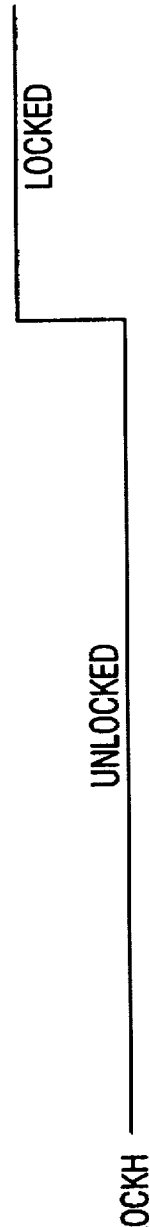

Timing diagrams of selected signals within the horizontal lock detector circuit of the present invention are illustrated in FIG. 3. The timing diagrams illustrated in FIG. 3 are shown to correspond to each other in time. The horizontal synchronization signal Sync is illustrated in FIG. 3a. The horizontal blanking signal HB is illustrated in FIG. 3b. A signal at the voltage node VX is illustrated in FIG. 3c. A signal at the voltage node VY is illustrated in FIG. 3d. The output signal LockH is illustrated in FIG. 3e.

When either one of the charge pump control signals UP or DOWN are active, the output of the logical NOR gate 10 (FIG. 2) is at a logical low voltage level. The current source IO is enabled and will supply current to the capacitor C1 when the output of the logical NOR gate 10 is at a logical low voltage level. During a non horizontal blanking period, when the horizontal blanking signal HB is at a logical high voltage level, the transistor Q1 is on and the capacitor C1 is discharged through the transistor Q1. During a horizontal blanking period, when the horizontal blanking signal HB is at a logical low voltage level, the transistor Q1 is off and the discharge path for the capacitor C1 is disabled. During this time, if either of the control signals UP or DOWN are active, the current source IO will supply current to the capacitor C1 and charge up the voltage level across the capacitor C1 and at the voltage node VCAP. When the voltage level at the voltage node VCAP reaches a logical high voltage level threshold, the output of the flip-flop 20 and the voltage level at the voltage node VX will be set to a logical high voltage level. As illustrated in FIGS. 3b and 3c, there is a delay from the beginning of the horizontal blanking period until the voltage level at the node VX is raised to a logical high voltage level because of the time necessary to charge the capacitor C1 and raise the voltage level at the voltage node VCAP to a logical high voltage level.

When the voltage level at the node VX is at a logical high voltage level, the capacitor C2 will charge, which raises the voltage level at the voltage node VY. The diode D2 provides a low impedance path through which the capacitor C2 is charged. When the voltage level at the voltage node VY rises above an unlocked threshold level of the schmitt trigger circuit 30, the output LockH of the schmitt trigger circuit 30 and of the horizontal lock detector is pulled to a logical low voltage level, signalling that the sampling pulses generated by the video system are not locked in phase with the input composite video signal. The schmitt trigger circuit 30 includes the unlocked threshold level and a locked threshold level. Because the schmitt trigger circuit 30 includes an inverter circuit, the unlocked threshold level is above the locked threshold level. When the voltage level at the voltage node VY rises above the unlocked threshold level, the output of the schmitt trigger circuit 30 is pulled to a logical low voltage level. When the voltage level at the node VY falls below the locked threshold level, the output of the schmitt trigger circuit 30 is raised to a logical high voltage level.

At the end of the horizontal blanking period, when the horizontal blanking signal HB rises to a logical high voltage level, the output of the flip-flop 20 and the voltage level at the voltage node VX are reset and pulled to a logical low voltage level. Because the horizontal blanking signal HB is at a logical high voltage level, the transistor Q1 is on and any charge stored across the capacitor C1 is discharged through the transistor Q1. The voltage level across the capacitor C2 and at the voltage node VY will therefore begin to discharge through the resistor R1. If the control signals UP and DOWN are active during the next horizontal blanking period, the voltage level across the capacitor C2 and at the voltage node VY will be charged up again. The values of the capacitor C2 and the resistor R1 have been chosen so that the voltage level across the capacitor C2 and at the voltage node VY will not be pulled below the locked threshold level of the schmitt trigger circuit 30 during a single non horizontal blanking period. Therefore, as long as the control signals UP and DOWN are active, the output LockH of the schmitt trigger circuit 30 will remain at a logical low voltage level.

Once the charge pump control signals UP and DOWN are both inactive, the current source IO is disabled and the capacitor C1 is not charged up during the horizontal blanking period. The voltage level at the voltage node VCAP will therefore not rise above a logical high voltage level threshold and will not set the flip-flop 20. Accordingly, the output of the flip-flop 20 and the voltage level at the voltage node VX is not set or raised to a logical high voltage level when the control signals UP and DOWN are both inactive. The voltage level across the capacitor C2 and at the voltage node VY will therefore discharge below the locked threshold level of the schmitt trigger circuit 30. The output LockH of the schmitt trigger circuit 30 and of the horizontal lock detector circuit of the present invention will correspondingly rise to a logical high voltage level, signalling that the sampling pulses generated by the video system are locked in phase with the input composite video signal. The output LockH will remain at a logical high voltage level until the charge pump control signals UP and DOWN are again active.

The preferred embodiment of the present invention is implemented within a video/graphics overlay integrated circuit, Part No. CXA2015Q, which will be available from Sony Corporation of America, 3300 Zanker Road, San Jose, Calif. 95134. A horizontal phase-lock loop within this video/graphics overlay integrated circuit is used to lock sampling pulses generated by the video system and used to sample the horizontal synchronization signal, in phase with an input composite video signal. The phase and frequency of the sampling pulses is adjusted by the horizontal phase-lock loop until they are locked in phase with the input composite video signal. A phase detector circuit within the horizontal phase-lock loop monitors the difference in phase between the sampling pulses and the input composite video signal. The phase detector circuit generates the charge pump control signals UP and DOWN which are used to control a charge pump circuit. The horizontal lock detector circuit of the present invention monitors the charge pump control signals generated by the phase detector circuit, as described above, in order to determine when the sampling pulses are locked in phase with the input composite video signal.

While the preferred embodiment of the present invention has been illustrated and described as an integrated circuit using bipolar transistors, it will be apparent to a person of ordinary skill in the art that the circuit of the present invention may be implemented using another device technology, including but not limited to CMOS, MOS, discrete components and ECL. It will also be apparent to those skilled in the art that different logic circuit configurations could be substituted for the logic circuit described above to perform the functions of the preferred embodiment.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

We claim:

1. A phase lock detector for detecting when sampling pulses generated by a video system are locked in phase with an input composite video signal comprising:
   a. a monitoring circuit for monitoring one or more control signals coupled as up and down inputs to a charge pump and used to control a phase of the sampling pulses, wherein the one or more control signals are inactive when the sampling pulses are locked in phase with the input composite video signal; and
   b. an output circuit coupled to the monitoring circuit for generating an output signal representative of whether the sampling pulses are locked in phase with the input composite video signal.

2. The phase lock detector as claimed in claim 1 further comprising a detection storage element for storing a detection level of charge.

3. The phase lock detector as claimed in claim 2 wherein the detection storage element is a capacitor.

4. The phase lock detector as claimed in claim 2 further comprising a charge delivery device coupled to the monitoring circuit and to the detection storage element for increasing the detection level of charge when the one or more control signals are active.

5. The phase lock detector as claimed in claim 4 further comprising a detecting circuit for detecting when the detection level of charge increases past a detection threshold value.

6. The phase lock detector as claimed in claim 5 further comprising a delay storage element coupled to the detecting circuit for storing a duration determination level of charge, wherein the duration determination level of charge is increased when the detection level of charge is above the detection threshold value.

7. The phase lock detector as claimed in claim 6 wherein the delay storage element is a capacitor.

8. The phase lock detector as claimed in claim 6 wherein the delay storage element is further coupled to the output circuit and the output signal is activated when the delay level of charge falls below a locked threshold value and deactivated when the delay level of charge rises above an unlocked threshold value.

9. A method of detecting when sampling pulses generated by a video system are locked in phase with an input composite video signal comprising the steps of:
   a. monitoring one or more control signals from a phase-lock loop, used to control a phase of the sampling pulses, wherein the one or more control signals are coupled as up and down inputs to a charge pump and inactive when the sampling pulses are locked in phase with the input composite video signal; and
   b. generating an output signal which is active when the one or more control signals are inactive for a predetermined period of time, representing that the sampling pulses are locked in phase with the input composite video signal.

10. The method as claimed in claim 9 further comprising the step of increasing a first level of charge across a detection storage element when the one or more control signals are active.

11. The method as claimed in claim 10 further comprising the step of detecting when the first level of charge increases past a detection threshold value.

12. The method as claimed in claim 11 further comprising the step of increasing a second level of charge across a second storage element when the first level of charge is above the detection threshold value.

13. The method as claimed in claim 12 wherein the output signal is activated when the second level of charge falls below a delay threshold value and deactivated when the level of charge rises above an unlocked threshold value.

14. A phase-lock loop circuit for locking sampling pulses generated by a video system in phase with an input composite video signal comprising:

a. a receiving circuit configured for receiving the input composite video signal;

b. a generating circuit configured for generating sampling pulses by which the input composite video signal is sampled within the video system;

c. a phase detector circuit coupled to the receiving circuit and to the generating circuit for detecting a phase difference between the sampling pulses and the input composite video signal and generating one or more control signals for adjusting a phase of the sampling pulses, wherein the one or more control signals are inactive when the sampling pulses are locked in phase with the input composite video signal;

d. a first storage element coupled to the phase detector circuit for building up a first level of charge across the first storage element in response to the one or more control signals;

e. a monitoring circuit coupled to the phase detector circuit for monitoring the one or more control signals; and for an output circuit coupled to the monitoring circuit for generating an output signal representative of whether the sampling pulses are locked in phase with the input composite video signal.

15. The phase-lock loop circuit as claimed in claim 14 further comprising a second storage element for storing a second level of charge.

16. The phase-lock loop circuit as claimed in claim 15 further comprising a charge delivery device coupled to the monitoring circuit and to the second storage element for increasing the second level of charge when the one or more control signals are active.

17. The phase-lock loop circuit as claimed in claim 16 further comprising a detecting circuit for detecting when the delay level of charge increases past a detection threshold value.

18. The phase-lock loop circuit as claimed in claim 17 further comprising a third storage element coupled to the detecting circuit for storing a third level of charge, wherein the third level of charge is increased when the second level of charge is above the detection threshold value.

19. The phase-lock loop circuit as claimed in claim 18 wherein the third storage element is further coupled to the output circuit and the output signal is activated when the third level of charge falls below a delay threshold value and deactivated when the third level of charge rises above an docked threshold value.

20. A phase lock detector for detecting when a first signal is locked in phase with a second signal comprising:

a. a monitoring circuit for monitoring one or more control signals coupled as up and down inputs to a charge pump and used to control a phase of a first signal, wherein the one or more control signals are inactive when the first signal is locked in phase with a second signal; and b. an output circuit coupled to the monitoring circuit for generating an output signal representative of whether the first signal is locked in phase with the second signal.

21. The phase lock detector as claimed in claim 20 further comprising a detection storage element for storing a detection level of charge.

22. The phase lock detector as claimed in claim 21 further comprising a charge delivery device coupled to the monitoring circuit and to the detection storage element for increasing the detection level of charge when the one or more control signals are active.

23. The phase lock detector as claimed in claim 22 further comprising a detecting circuit for detecting when the detection level of charge increases past a detection threshold value.

24. The phase lock detector as claimed in claim 23 further comprising a delay storage element coupled to the detecting circuit for storing a delay level of charge, wherein the delay level of charge is increased when the detection level of charge is above the detection threshold value.

25. The phase lock detector as claimed in claim 24 wherein the second storage element is further coupled to the output circuit and the output signal is activated when the second level of charge falls below a delay threshold value and deactivated when the second level of charge rises above an unlocked threshold value.

* * * * *

UNITED STATES PATENT AND TRADEMARK OFFICE
CERTIFICATE OF CORRECTION

PATENT NO.: 5,719,532

DATED: February 17, 1998

INVENTORS: Mehrdad Nayebi *et al.*

It is certified that error appears in the above-identified patent and that said Letters Patent is hereby correct as shown below:

Title page, item [57],

<u>IN THE ABSTRACT</u>:

In line 24 of the Abstract, delete "fell" and insert --falls--.

In column 1, line 24, delete "provided" and insert --output--.
In column 1, line 25, delete "output" and insert --provided--.
In column 4, line 22, delete "signal while" and insert --signal. While--.
In column 4, line 48, delete "active" and insert --first--.
In column 4, line 49, delete "first" and insert --active-.

UNITED STATES PATENT AND TRADEMARK OFFICE
CERTIFICATE OF CORRECTION

PATENT NO. : 5,719,532
DATED : February 17, 1998
INVENTOR(S) : Mehrdad Nayebi, et. al.

It is certified that error appears in the above-identified patent and that said Letters Patent is hereby corrected as shown below:

In column 9, line 29, delete the first occurrence of the word "for" and insert --f.--.
In column 10, line 9, delete "docked" and insert --unlocked--.

Signed and Sealed this

Twenty-second Day of September, 1998

Attest:

BRUCE LEHMAN

Attesting Officer

Commissioner of Patents and Trademarks